United States Patent [19]
Ihara et al.

[11] Patent Number: 5,227,999
[45] Date of Patent: Jul. 13, 1993

[54] SEMICONDUCTOR MEMORY DEVICE CAPABLE OF REPLACING FAULTY BIT LINES WITH REDUNDANT BIT LINES

[75] Inventors: Makoto Ihara; Kazuaki Ochiai, both of Tenri, Japan

[73] Assignee: Sharp Kabushiki Kaisha, Osaka, Japan

[21] Appl. No.: 681,747

[22] Filed: Apr. 8, 1991

[30] Foreign Application Priority Data

Apr. 19, 1990 [JP] Japan ................. 2-103956

[51] Int. Cl.$^5$ .............................. G11C 29/00
[52] U.S. Cl. .................. 365/200; 371/10.3; 371/10.1
[58] Field of Search ............ 365/200, 201; 371/10.1, 371/10.2, 10.3

[56] References Cited

U.S. PATENT DOCUMENTS

| | | | |
|---|---|---|---|
| 4,729,117 | 3/1988 | Osaka | 365/200 |
| 4,998,223 | 3/1991 | Akaogi | 365/200 |
| 5,045,720 | 9/1991 | Bae | 371/10.2 |
| 5,134,585 | 7/1992 | Murakami et al. | 371/10.1 |

FOREIGN PATENT DOCUMENTS

| | | | |
|---|---|---|---|
| 0131930 | 1/1985 | European Pat. Off. | 365/200 |
| 58-130495 | 8/1983 | Japan | 365/200 |
| 63-2351 | 1/1988 | Japan . | |
| 64-14800 | 1/1989 | Japan . | |

Primary Examiner—Robert J. Pascal
Assistant Examiner—Tan Dinh
Attorney, Agent, or Firm—Nixon & Vanderhye

[57] ABSTRACT

A semiconductor memory device has a plurality of pairs of bit lines and one or more pairs of redundant bit lines to replace faulty bit lines, if any. The redundant bit lines are connected with a first pair of data lines, which is connected to a differential amplifier, by respective second switches, and the bit lines are connected with a second pair of data lines by respective first switches. A third switch is provided between the first and second data lines, and the second data lines are connected to or disconnected from the first data lines by the third switch. There are also provided column decoders connected to the respective first switches and redundant column decoders connected to both the respective second switches and the third switch. When either redundant column decoder outputs a redundant signal for connecting the redundant bit lines to the first data lines, the third switch is turned off to disconnect the second data lines from the first data lines and therefore from the differential amplifier. On the other hand, when every redundant column decoder outputs a non-redundant signal for disconnecting the redundant bit lines from the first data lines, the third switch is turned on to connect the second data lines to the first data lines and therefore to the differential amplifier.

4 Claims, 4 Drawing Sheets

SEMICONDUCTOR MEMORY DEVICE CAPABLE OF REPLACING FAULTY BIT LINES WITH REDUNDANT BIT LINES

BACKGROUND OF THE INVENTION

1. Field of the Invention

The present invention relates to a semiconductor memory device incorporating redundant bit lines for replacing faulty bit lines.

2. Description of the Prior Art

Recently, the environmental cleanness in the process for manufacturing semiconductor devices has steadily been improved. Nevertheless, it is still extremely difficult for the concerned to fully prevent faulty circuits from occurring in the manufacture of semiconductor memory devices. To solve this problem, conventional semiconductor memory devices generally incorporate a redundant circuit which operates itself in place of a faulty circuit.

Figure 1:
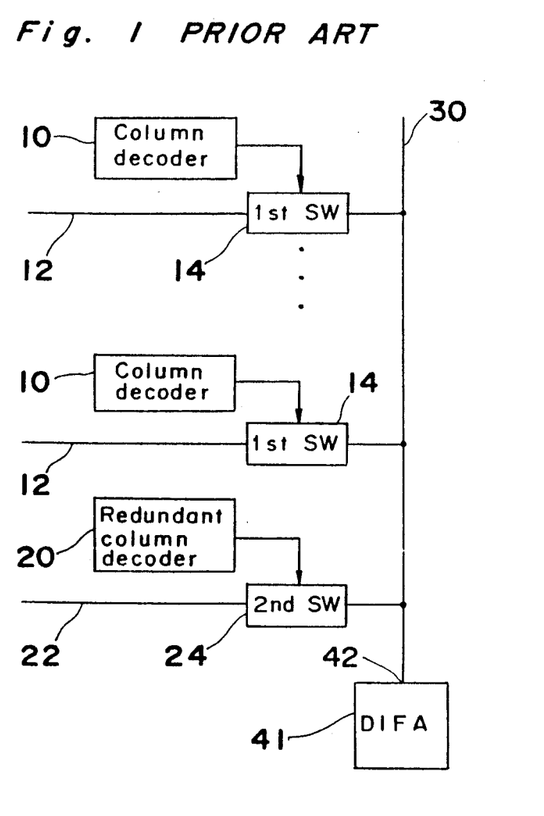
FIG. 1 is a simplified block diagram of a conventional semiconductor memory device cited in the above description.

FIG. 1 is a block diagram of such a conventional semiconductor memory device having a redundant circuit. This conventional semiconductor memory device is adapted to replace a pair of complementary faulty bit lines 12 having malfunctioned in a test carried out during the manufacturing process with a pair of complementary redundant bit lines 22. A plurality of pairs of complementary bit lines 12 including the pair of faulty ones 12 are each connected to a pair of complementary data lines 30 via a first switch 14 controlled by a column decoder 10, whereas the pair of complementary redundant bit lines 22 is connected to the pair of data lines 30 via a second switch 24 controlled by a redundant column decoder 20.

It is to be noted that in FIG. 1 the pairs of complementary bit lines 12, redundant bit lines 22, and data lines 30 are each represented by a single line.

The pair of redundant bit lines 22 is connected to the pair of data lines 30 between the bit lines 12 and an input terminal 42 of a differential amplifier 41, as shown in FIG. 1.

Each column decoder 10 contains a fuse which is not shown specifically in the figure. According to the design applied to this conventional semiconductor memory device, when the fuse is cut off, the first switch 14 is turned OFF, whereas while the fuse remains conductive, the column decoder 10 controls an ON-OFF operation of the first switch 14 based on a column address signal received from an address bus (not shown). The fuse of the column decoder 10 connected to the faulty bit lines 12 is disconnected in a test carried out during the manufacturing process, whereas the fuse of the column decoder 10 connected to the normally operative bit lines is held conductive.

As a result, after completing the manufacturing process, the pair of faulty bit lines 12 is prohibited from being operatively connected to the data lines 30 even when the column address signal designating the faulty bit lines 12 is delivered to the column decoder 10 connected to the faulty bit lines 12. On the other hand, when the column decoder 10 connected to a pair of normally operative bit lines 12 receives the column address signal designating selection of this pair of normal bit lines 12, these normal bit lines 12 are connected to the pair of data lines 30.

The redundant column decoder 20 is designed to contain a fuse (not shown) which performs a function inverse from that provided in each of the column decoders 10. Concretely, when the fuse in the redundant column decoder 20 is cut, the redundant column decoder 20 controls an ON-OFF operation of the second switch 24 based on a column address signal received from the address bus, whereas, when the fuse remains conductive, independent of the content of the column address signal, the redundant column decoder 20 turns the second switch 24 OFF. If those bit lines 12 contain any faulty bit lines 12 in the course of an operating test during the manufacturing process, then the fuse of the redundant column decoder 20 is cut off. At the same time, a column address of the pair of faulty bit lines 12 is written in a column address detecting portion of the redundant column decoder 20, thereby the redundant column decoder 20 stores the column address of the pair of faulty bit lines 12. On the other hand, in the event that no faulty bit lines are present in those bit lines 12, then the fuse of the redundant column decoder 20 remains conductive.

After completing the manufacturing process, on receipt of a column address signal designating the faulty bit lines 12, the redundant column decoder 20 outputs a redundant signal instructing to turn the second switch 24 ON. Thereby, the second switch 24 is turned ON to allow the pair of redundant bit lines 22 to be connected to the pair of complementary data lines 30. On the other hand, on receipt of a column address signal designating a pair of normal bit lines 12, the redundant column decoder 20 outputs a non-redundant signal for turning the second switch 24 OFF. Consequently, the second switch 24 is turned OFF to disconnect the complementary redundant bit lines 22 from the pair of complementary data lines 30. If there are no faulty bit lines in those bit lines 12, then the pair of redundant bit lines 22 remains disconnected from the pair of data lines 30.

As mentioned above, the cited conventional semiconductor memory device allows the redundant bit lines 22 to be connected to the complementary data lines 30 in place of the faulty bit lines 12 based on the functional operation of those fuses provided in the column decoders 10 and the redundant column decoder 20.

The differential amplifier 41 receives data signal from a pair of normally operative bit lines 12 selected or the redundant bit lines 22 via the complementary data lines 30 before eventually amplifying the received data signal.

Recently, a significant progress has been achieved in the field of semiconductor memory devices. Those memory devices including a random access memory (RAM), a read-only memory (ROM), or the like, have respectively quadrupled the integration density every three years. And yet, in order to minimize surface area of each chip, manufacturers follow up their efforts to simplify component circuits of those semiconductor memory devices.

As a result of comprehensive study on the redundant circuits, the present inventors become aware of a fact that each column decoder 11 compulsorily contained fuses notwithstanding that all the bit lines 12 would not simultaneously malfunction, and thus resulted in the expanded surface area of each chip.

SUMMARY OF THE INVENTION

The object of the present invention is therefore to provide a novel semiconductor memory device incorporating one or more redundant bit lines which dispenses with provision of fuses in the column decoders so that the surface area of each chip can securely be reduced.

Figure 2:
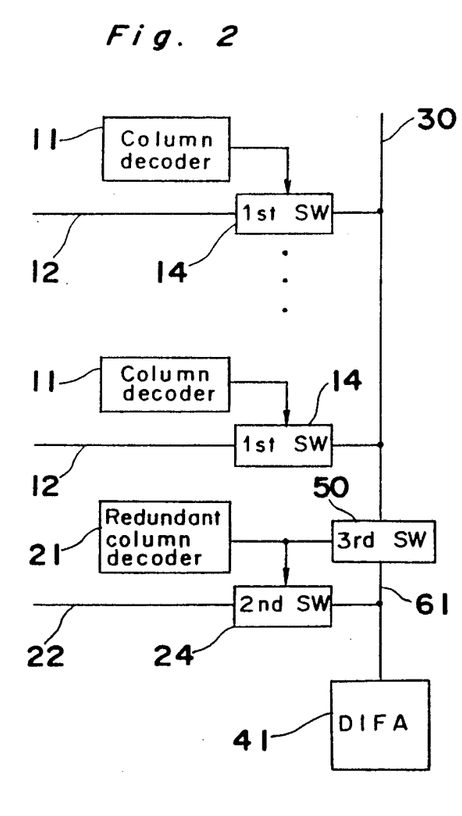
FIG. 2 is a block diagram showing the concept of the present invention.

FIG. 2 shows the concept of the present invention.

In order to achieve the above object, as shown in FIG. 1, the present invention provides a novel semiconductor memory device which characteristically comprises the following:

(a) a differential amplifier 41;
(b) a first pair of complementary data lines 61 to be connected to the differential amplifier;
(c) a second pair of complementary data lines 30 to be connected to the differential amplifier 41 through connection with the first pair of data lines 61;
(d) a plurality of pairs of complementary bit lines 12 to be connected to the second pair of complementary data lines 30;
(e) a plurality of column decoders 11 for, in response to a column address signal, outputting a control signal;
(f) first switching means 14 for connecting respective ones of the plurality of pairs of complementary bit lines 12 to the second pair of complementary data lines 30 in response to the control signal from respective ones of the plurality of column decoders 11;
(g) one or more pairs of complementary redundant bit lines 22 to be connected to the first pair of complementary data lines 61;
(h) one or more redundant column decoders 21 each of which includes means for storing column address data of a pair of faulty bit lines, if any, and outputs a redundant signal in response to a column address signal indicative of the column address data stored;
(i) second switching means 24 for connecting respective ones of the one or more pairs of complementary redundant bit lines 22 to the first pair of complementary data lines 61 in response to the redundant signal from respective ones of the one or more redundant column decoders 21; and
(j) third switching means 50 installed between the first and second pairs of complementary data lines 61 and 30 for connecting the second pair of complementary data lines 30 to the first pair of complementary data lines 61, said third switching means 50 disconnecting the second pair of complementary data lines 30 from the first pair of complementary data lines 61 in response to the redundant signal from any one of the redundant column decoders 21.

It is to be noted that each pair of complementary bit lines 12, redundant bit lines 22, and data lines 30 and 61 is represented by a single line in FIG. 2.

The semiconductor memory device of the present invention executes those functional operations described below, on the assumption that a pair of faulty bit lines 12 is present in the plurality of bit lines 12 and one redundant column decoder 21 stores the column address of the faulty bit line pair 12 when being subjected to a test during a manufacturing operation.

In the event that a column address signal selects the pair of faulty bit lines from among the plurality of bit lines 12, the redundant column decoder 20 outputs a redundant signal for turning the corresponding second switch 24 ON. In response to this redundant signal, the second switch 24 is turned ON, while the third switch 50 is turned OFF. As a result, independent of the ON-OFF condition of the first switch 14 for the faulty bit lines, only the pair of redundant bit lines 22 connected to the second switch 24 is allowed to connect with the differential amplifier 41. In other words, the pair of faulty bit lines 12 is replaced by the pair of redundant bit lines 22. In this case, no problem arises even when the column decoder 11 connected to the faulty bit lines 12 turns the first switch 14 ON in response to the column address signal. It is assumed that the other column decoders 11 connected to the pairs of normal bit lines 12 not selected by the column address signal turn the respective first switches 14 OFF as in the conventional semiconductor memory device.

On the other hand, when a column address signal designates some pair of normal bit lines 12, every redundant column decoder 20 outputs a non-redundant signal for turning the second switches 24 OFF. In response to this non-redundant signal, the one or more second switches 24 are turned OFF. As a result, the redundant bit lines 22 are disconnected from the first data lines 61. On the other hand, on receipt of this non-redundant signal, the third switch 50 is turned ON to connect the second data lines 30 to the first data lines 61 connected to the differential amplifier 41. In this case, the column decoder 11 connected to the normal bit lines 12 selected outputs a control signal to turn the corresponding first switch 14 ON as in the conventional semiconductor memory device. As a result, the selected pair of normal bit lines 12 is connected to the differential amplifier 41 via the second data lines 30 and the first data lines 61. The column decoders 11 connected to the unselected bit lines 12 turn the corresponding first switches 14 OFF.

In this way, the faulty bit lines 12 are replaced by the redundant bit lines 22. According to the present invention, whether faulty bit lines 12 are selected or whether normal bit lines 12 are selected by a column address signal, the column decoder 11 for the selected bit lines 12 is permitted to turn the corresponding first switch 14 ON, while the other column decoders 11 for unselected bit lines turn the corresponding first switches OFF. Because of the structure mentioned above, in contrast with the conventional semiconductor memory device, the semiconductor memory device of the present invention dispenses with provision of fuses in respective column decoders 11 which will be otherwise needed for inactivating operations of these column decoders 11. By virtue of the elimination of fuses, the semiconductor memory device of the present invention can reduce the pattern of the column decoders 11, thus effectively minimizing the surface area of the chip itself.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 3:
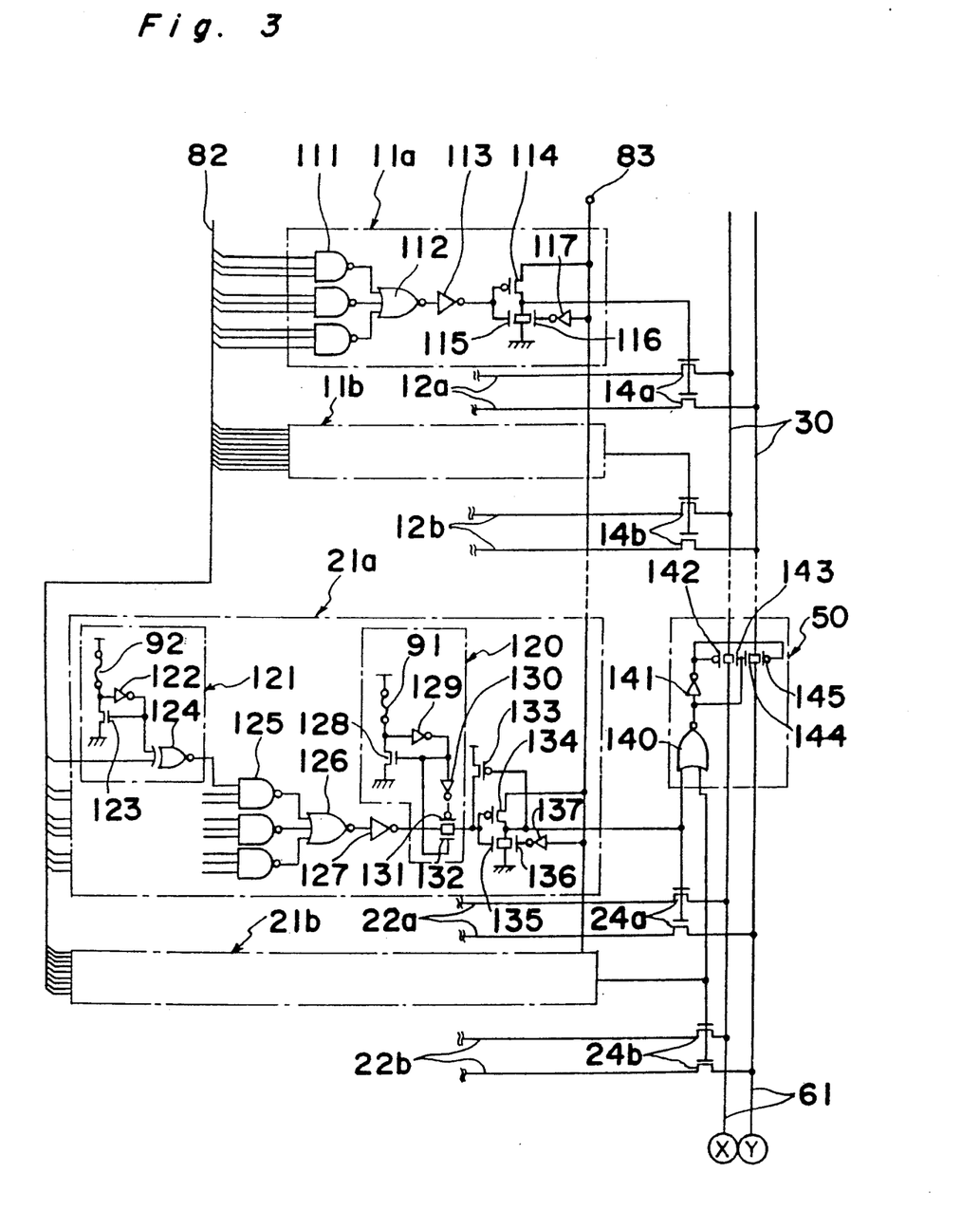
FIG. 3 is a circuit diagram showing one part (a circuit block) of a semiconductor memory device according to an embodiment of the invention, wherein there are provided a plurality of pairs of redundant bit lines.
Figure 4:
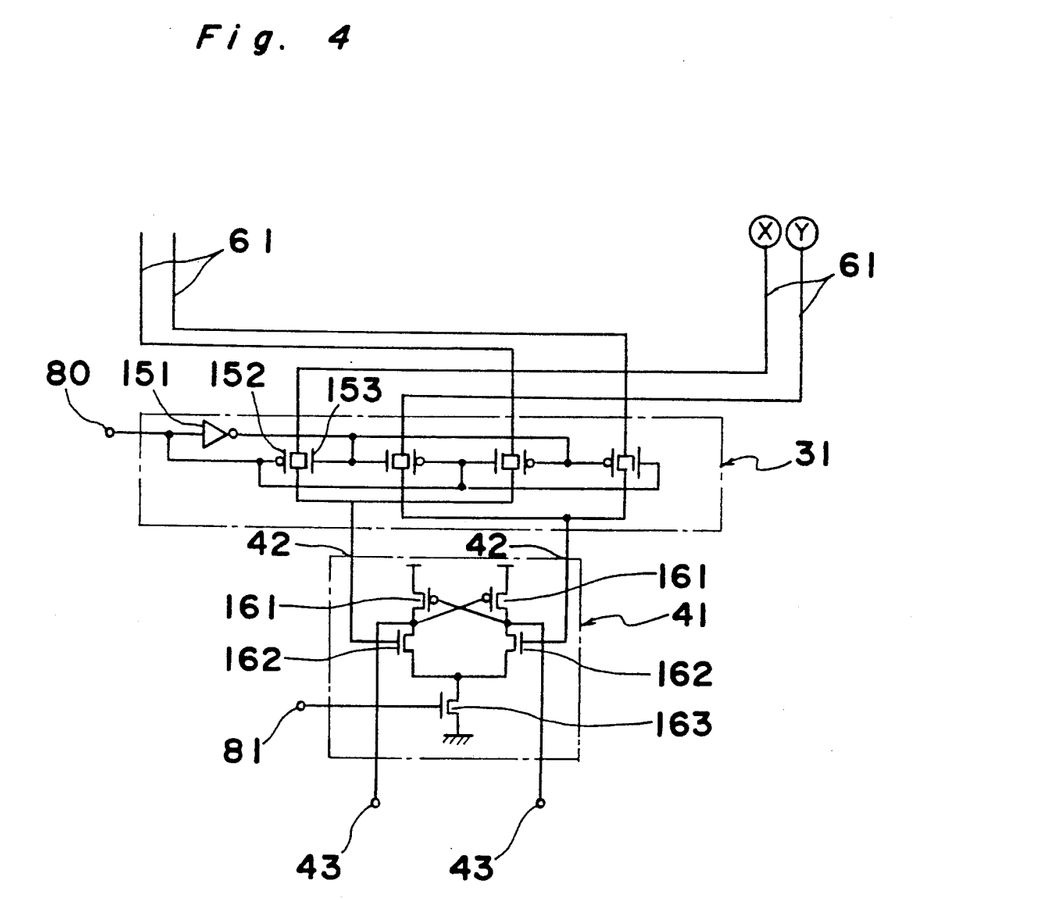
FIG. 4 is a circuit diagram showing another part of the semiconductor memory device according to the embodiment.

As shown in FIGS. 3 and 4, a semiconductor memory device according to an embodiment of the present invention incorporates the following: a plurality of pairs of complementary bit lines 12a, 12b, . . . (note that only 12a and 12b are shown for the sake of simplicity and that all of the plurality of pairs of bit lines are represented by these two pairs 12a and 12b in the following description), two pairs of complementary redundant bit lines 22a and 22b, a pair of complementary data lines 30, another pair of complementary data lines 61, a plurality of column decoders 11a and 11b which are respectively provided for the respective pairs of bit lines 12a and 12b, redundant column decoders 21a and 21b which are provided for the respective pairs of the redundant bit lines 22a and 22b, a differential amplifier 41 connected to the pair of data lines 61. The pair of data lines 61 shown in FIGS. 3 and 4 are connected at X and Y.

There is provided a pair of N-channel transistors 14a, 14b as the first switch 14 shown in FIG. 2 between each pair of bit lines 12a, 12b and the pair of data lines 30. On the other hand, there is provided a pair of N-channel transistors 24a, 24b as the second switch 24 shown in FIG. 2 between each pair of redundant bit lines 22a, 22b and the pair of data lines 61. Signals output from those column decoders 11a, 11b and the redundant column decoders 24a, 24b are respectively delivered to gate electrodes of the N-channel transistors 14a and 14b and the N-channel transistors 24a and 24b, respectively so that these transistors can respectively be turned ON and OFF.

A third switch 50 is installed between the pair of data lines 30 and the pair of data lines 61. In addition, a fourth switch 31 (see FIG. 4) is installed between the data lines 61 and a pair of input terminals 42 of the differential amplifier 41.

An address bus 82 is installed on the part of input terminals of the column decoders 11a, 11b, and of the redundant column decoders 21a and 21b. On the other hand, a data signal output line 83 is installed on the part of output terminals of these decoders 11a, 11b, 21a, 21b.

As shown in FIG. 3, the column decoders 11a and 11b are each comprised of the following: three NAND circuits 111, a NOR circuit 112, an inverter 113, a P-channel transistor 114 and an N-channel transistor 115 which are connected in series between the data signal output line 83 and a grounding conductor, an N-channel transistor 116 which is installed in parallel with the N-channel transistor 115, and another inverter 117 connected between a gate electrode of the N-channel transistor 116 and the data signal output line 83.

On receipt of a column address signal designating a pair of bit lines from the address bus 82, the column decoder 11a, for example, decodes the received column address signal by means of the NAND circuits 111 and the NOR circuit 112.

When the column address signal designates the pair of bit lines 12a connected to the column decoder 11a, the gates of the P-channel transistor 114 and the N-channel 115 respectively become a "0" level via the inverter 113. Under this condition, when the data signal output line 83 is at a "1" level, the P-channel transistor 114 turns itself ON, whereas the N-channel transistor 115 turns itself OFF, thus allowing the column decoder 11a to output a "1" level signal. This in turn activates the pair of transistors 14a so that the pair of bit lines 12a a can be connected to the pair of data lines 30.

On the other hand, when the column address signal designates a pair of bit lines other than the pair of bit lines 12a, the gates of the P-channel transistor 114 and the N-channel transistor 115 respectively become "1" level. At this time, if the data signal output line 83 is at "1" level, the P-channel transistor 114 is turned OFF, whereas the N-channel transistor 115 is turned ON, and as a result, the transistors 14a are turned OFF to disconnect the complementary bit lines 12a from the complementary data lines 30.

In both of the above cases, since the data signal output line 83 assumes the "1" level, the gate electrode of the N-channel transistor 116 receives a "0" data signal from the inverter 117 to cause the N-channel transistor 116 to turn OFF. This in turn allows the column decoder 11a to output a "1" level signal. However, if the data signal output line 83 assumes a "0" level, the N-channel transistor 116 is turned ON to inhibit the column decoder 11a from delivering a "1" level output signal.

Similarly to the column decoders 11a, 11b, the redundant column decoders 21a and 21b each have the following: three NAND circuits 125, a NOR circuit 126, an inverter 127, a P-channel transistor 134 and an N-channel transistor 135 which are connected in series between the data signal output line 83 and the grounding conductor, an N-channel transistor 136 which is installed in parallel with the N-channel transistor 135, and another inverter 137 connected between a gate electrode of the N-channel transistor 136 and the data signal output line 83.

In addition, the redundant column decoders 21a and 21b each further incorporate an activating circuit 120, nine units of column address detecting circuit 121 (only one is shown), and a P-channel transistor 133 available for latching output signals.

The activating circuit 120 of, for example, the redundant column decoder 21a consists of a fuse 91, an inverter 129, an N-channel transistor 128, an inverter 130, and a P-channel transistor 131 and an N-channel transistor 132 which are connected in parallel with each other between the inverter 127 and a conjunction of the N-channel and P-channel transistors 134, 135. In the event that any of those pairs of bit lines 12a and 12b malfunctions in a test during the manufacturing process, the fuse 91 is cut off. The following description refers to a case in which the pair of complementary bit lines 12a are faulty, and the fuse 91 of the redundant column decoder 21a is already cut.

Since the fuse 91 is already disconnected, the output terminal of the inverter 129 is held at a "1" level, and this condition is retained by the N-channel transistor 128. At the same time, the gate of the N-channel transistor 132 also turns into a "1" level, whereas the gate of the P-channel transistor 131 turns into a "0" level through the inverter 130. As a result, the N-channel transistor 132 and the P-channel transistor 131 are respectively turned ON. This in turn permits the redundant column decoder 21a to transmit signals from the input terminal to the output terminal via the N-channel transistor 132 and the P-channel transistor 131. In other words, the redundant column decoder 21a is activated.

On the other hand, the nine units of the column address detecting circuit 121 are each composed of a fuse 92, an inverter 122, an N-channel transistor 123, and an exclusive NOR circuit 124. When the fuse 91 of the activating circuit 120 is cut, some of these nine fuses 92 provided in the column address detecting circuits 121 are cut and the others are not so that the column address of the malfunctioned bit lines 12a can be represented. Depending on the disconnected or connected condition of the fuse 92, the output terminal of the inverter 122 assumes either "1" or "0" level, and these binary conditions are retained by the N-channel transistor 123. In other words, depending on the disconnected or connected conditions of these nine fuses 92, the column address detecting circuits 121 altogether store the column address of the malfunctioned bit lines 12a.

On receipt of a column address signal from the address bus 82, the column address detecting circuits 121 check to see if the content of the received column address signal correctly matches the stored column address of the faulty bit lines 12a or not by operating the exclusive NOR circuits 124. Furthermore, in each column address detecting circuit 121, the NAND circuits 125 and the NOR circuit 126 decode output from the exclusive NOR circuit 124. When the content of the received column address signal is identical to the column address of the faulty bit lines 12a, output of the inverter 127 turns into a "0" level. Conversely, if the content of the received column address signal is not identical to the column address of the faulty bit lines 12a, then output of the inverter 127 turns into a "1" level. Output from the inverter 127 is delivered to the gates of the P-channel transistor 134 and the N-channel transistor 135 via the activated P-channel transistor 131 and N-channel transistor 132. The P-channel transistor 134 and the N-channel transistor 135 operate in the same way as the P-channel transistor 114 and the N-channel transistor 115 of those column decoders 11a and 11b. Specifically, when the gates of these transistors 134 and 135 respectively remain at a "0" level, the redundant column decoder 21a outputs a "1" level redundant signal, whereas when the gates of these transistors 134 and 135 respectively remain at a "1" level, the redundant column decoder 21a outputs a "0" level non-redundant signal.

Accordingly, when the content of the column address signal received by the redundant column decoder 21a is identical to the column address of the faulty bit lines 12a, the pair of transistors 24a as the second switch is activated so that the pair of redundant bit lines 22a is connected to the pair of data lines 61. On the other hand, when the content of the column address signal received by the redundant column decoder 21a is not identical to the column address of the faulty bit lines 12a, the transistors 24a are respectively turned OFF, and as a result, the redundant bit lines 22a are disconnected from the data lines 61. Like the N-channel transistors 116 and the inverters 117 of those column decoders 11a and 11b, the N-channel transistor 136 and the inverter 117 permit the output terminal of the redundant column decoder 21a to become a "1" level.

The third switch 50 provided between the pair of data lines 30 and the pair of data lines 61 consists of the following: a NOR circuit 140, an inverter 141, a pair of P-channel transistors 142 and 145 which are respectively connected between the data lines 30 and the data lines 61, and a pair of N-channel transistors 143 and 144 which are respectively connected in parallel to those P-channel transistors 142 and 145. In the event that both or either of these redundant column decoders 21a and 21b output(s) a "1" level redundant signal, the NOR circuit 140 outputs a "0" level signal in response to the output from the redundant column decoders 21a and 21b. When both the redundant column decoders 21a and 21b simultaneously output a "0" level non-redundant signal, the NOR circuit 140 outputs a "1" level signal. On receipt of the signal output from the NOR circuit 140 at the gates, those N-channel transistors 143 and 144 are respectively turned ON in the event that the signal from the NOR circuit 140 is of "1" level. On the other hand, when the NOR circuit 140 delivers a "0" level signal, those N-channel transistors and 144 are respectively turned OFF.

The P-channel transistors 142 and 145 receive output from the NOR circuit 140 through the inverter 141. If output from the NOR circuit 140 is of "1" level, then, like the N-channel transistors 143 and 144, the P-channel transistors 142 and 145 respectively turn themselves ON. If the signal from the NOR circuit 140 is of "0" level, then the P-channel transistors 142 and 145 respectively turn themselves OFF. In consequence, when both or either of the redundant column decoders 21a and 21b output(s) a "1" level signal, both the P-channel transistors 142 and 145 and the N-channel transistors 143 and 144 altogether turn themselves ON. In other words, the third switch 50 is activated to permit the complementary data lines 30 and the other complementary data lines 61 to be continuous to each other. On the other hand, when both the redundant column decoders 21a and 21b simultaneously output a "0" level signal, all of the P-channel transistors 142 and 145 and the N-channel transistors 143 and 144 turn themselves OFF. In other words, the third switch 50 is turned OFF to disconnect the data lines 30 from the other data lines 61.

As shown in FIG. 4, the fourth switch 31 consists of the following: an input terminal 80 for receiving a block selecting signal, an inverter 151, four P-channel transistors 152, and four N-channel transistors 153 which are respectively connected in parallel to those P-channel transistors 152, making pairs with the respective P-channel transistors 152.

Functional operations of the fourth switch 31 are described below. When the block selecting signal 80 is at a "0" level, of those four pairs of P-channel and N-channel transistors 152 and 153, two pairs of P-channel and N-channel transistors 152 and 153 on the left side in the figure are respectively activated. This permits the data lines 61 linked with the circuit block shown in FIG. 3 to respectively be connected to the differential amplifier 41. When the block selecting signal 80 is at a "1" level, two pairs of the N-channel and P-channel transistors 153 and 152 on the right-hand side of the figure are activated, so that the data lines 61 connected to another circuit block having the same structure as that shown in FIG. 3 are made continuous to the differential amplifier 41. The description here refers to a case in which the block selecting signal 80 assumes a "0" level and selects the circuit block shown in FIG. 3.

The differential amplifier 41 consists of the following: a pair of P-channel transistors 161 which are respectively connected to a power-supply source, a pair of N-channel transistors 162 which are respectively connected to these P-channel transistors 161, and an N-channel transistor 163 which is connected between the contact of these N-channel transistors 162 and the grounding conductor. When a differential amplifier drive signal 81 of a "1" level is applied to a gate of the N-channel transistor 163, the P-channel transistors 161 and the N-channel transistors 162 respectively function as "pull-up" and "pull-down" transistors in order to differentially amplify data between the input terminals 42.

As a whole, the semiconductor memory device of this embodiment executes those functional operations described below.

When a column address signal on the address bus 82 shown in FIG. 3 designates the pair of bit lines 12a which are faulty, the redundant column decoders 21a and 21b respectively output "1" level and "0" level signals. On receipt of these signals from the redundant column decoders 21a and 21b, the transistors 24a are respectively turned ON, whereas the transistors 24b and the third switch 50 are respectively turned OFF. As a result, only the redundant bit lines 22a are connected to the data lines 61. In other words, the faulty bit lines 12a are replaced by the redundant bit lines 22a. Then, signals transmitted from those redundant bit lines 22a to the data lines 61 are differentially amplified by the differential amplifier 41. At this time, on receipt of the column address signal, the column decoder 11a outputs a "1" level signal. As a result, the transistors 14a are respectively activated to cause the faulty bit lines 12a to be connected to the data lines 30. However, since the third switch 50 remains OFF, these faulty bit lines 12a cannot be connected to the data lines 61, and thus no adverse effect can be generated. The column decoder 11b connected to the pair of normally operative bit lines 12b not selected by the column address signal outputs a "0" level signal. As a result, the transistors 14b respectively remain OFF, and thus, the normally operative bit lines 12b are respectively disconnected from the data lines 30.

On the other hand, when the column address signal of the address bus 82 designates the pair of normally operative bit lines 12b for example, the redundant column decoders 21a and 21b respectively output a "0" level signal. On receipt of these "0" level signals, the transistors 24a and 24b as the second switches are respectively turned OFF, whereas the third switch 50 is turned ON. As a result, the redundant bit lines 22a and 22b are respectively disconnected from the pair of complementary data lines 61.

On the other hand, the pair of data lines 61 are connected to the other pair of data lines 30. At this time, the column decoder 11b is outputting a "1" level signal in response to the same column address signal. As a result, the transistors 14b as the first switch are turned ON to connect the normally operative bit lines 12b to the data lines 30. In consequence, the normally operative bit lines 12b are respectively connected to the differential amplifier 41 via the data lines 30, the activated third switch 50, and then the other data lines 61. The differential amplifier 41 therefore differentially amplifies signals delivered from the normally operative bit lines 12b. The column decoder 11a connected to the faulty bit lines 12a not selected by the column address signal then outputs a "0" level signal. As a result, the transistors 14a respectively remain OFF, and thus the bit lines 12a not selected by the column address signal are disconnected from the data lines 30.

In this way, the faulty bit lines 12a can properly be replaced by the redundant bit lines 22a. Furthermore, owing to the functional operation of the third switch 50, like column decoders such as the column decoder 11b connected to the normally operative bit lines 12b, even the column decoder 11a connected to the faulty bit lines 12a is allowed to output either a "1" or "0" level signal based on the column address signal. Therefore, in order to inactivate the column decoders 12a, 12b, there is no need of providing fuses for these column decoders 12a, 12b. It is therefore possible to effectively reduce the pattern of respective column decoders 12a and 12b and consequently to reduce superficial area of the chip itself.

Although not being described above for the sake of simplifying the accompanying drawings, actually, the semiconductor memory device is further provided with a bias circuit for biasing each pair of data lines 30 and 61 and a plurality of short circuits to implement short circuit between the complementary data lines 30, between the other complementary data lines 61, and between the output terminals 43 of the differential amplifier 41.

Figure 5:
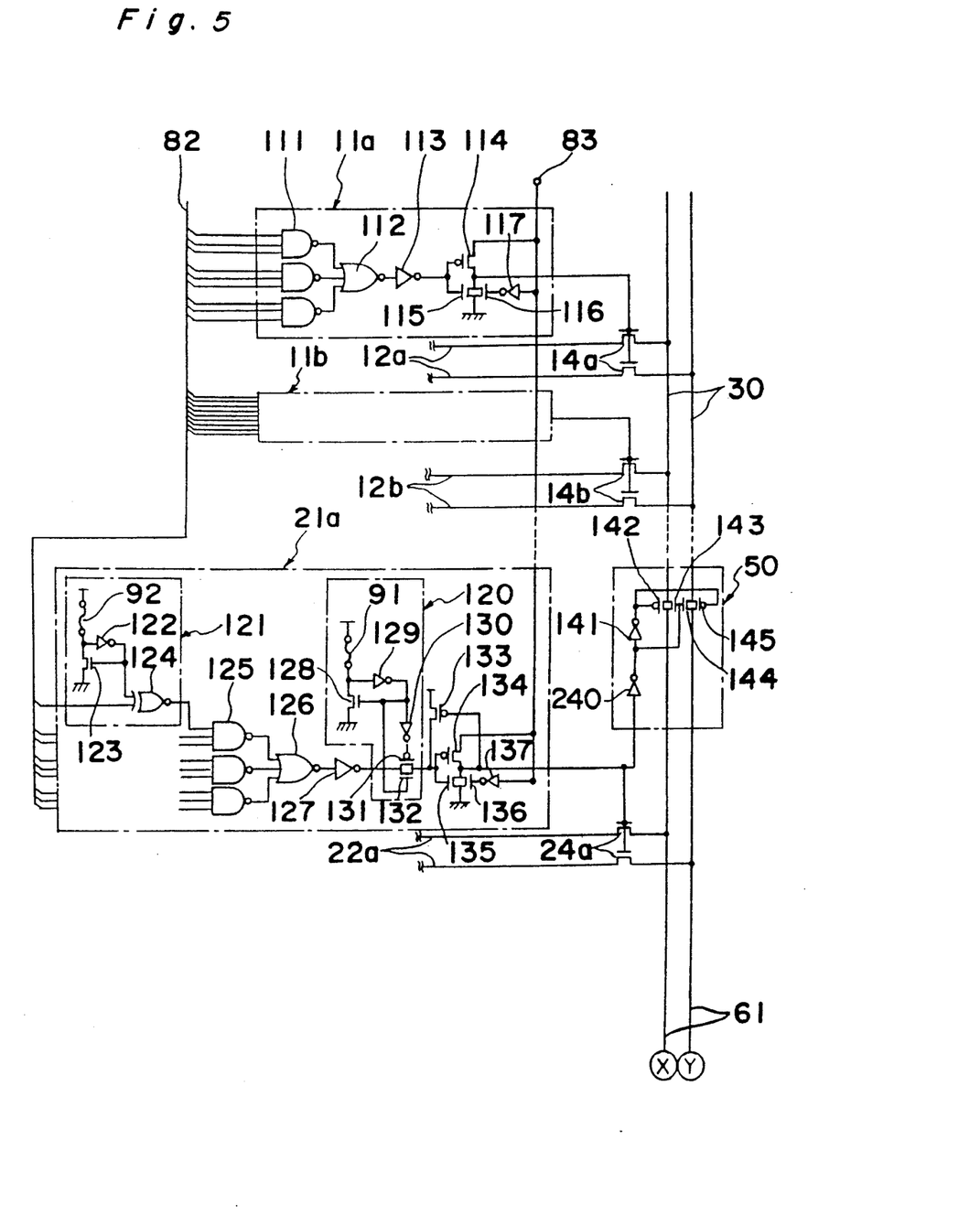
FIG. 5 is a circuit diagram showing one part (a circuit block) of another embodiment of the present invention, wherein there is provided a single pair of redundant bit lines.

FIG. 5 shows a circuit block according to another embodiment of the present invention. This circuit block has only one pair of redundant bit lines 22a, instead of having a plurality of pairs of redundant bit lines. In this case, the NOR circuit 140 in the third switch 50 of FIG. 3 is replaced with an inverter 240.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device capable of replacing any faulty bit lines with redundant bit lines, comprising:
   a differential amplifier;
   a first pair of complementary data lines to be connected to the differential amplifier;
   a second pair of complementary data lines to be connected to the differential amplifier through connection with the first pair of data lines;
   a plurality of pairs of complementary bit lines to be connected to the second pair of complementary data lines;
   a plurality of column decoders for, in response to a column address signal, outputting a control signal;
   first switching means for connecting respective ones of the plurality of pairs of complementary bit lines to the second pair of complementary data lines in response to the control signal from respective ones of the plurality of column decoders;
   one or more pairs of complementary redundant bit lines to be connected to the first pair of complementary data lines;
   one or more redundant column decoders each of which includes means for storing column address data of a pair of faulty bit lines, if any, and outputs a redundant signal in response to a column address signal indicative of the column address data stored;
   second switching means for connecting respective ones of the one or more pairs of complementary redundant bit lines to the first pair of complementary data lines in response to the redundant signal from respective ones of the one or more redundant column decoders;

third switching means installed between the first and second pairs of complementary data lines for connecting the second pair of complementary data lines to the first pair of complementary data lines, said third switching means disconnecting the second pair of complementary data lines from the first pair of complementary data lines in response to the redundant signal from any one of the redundant column decoders.

2. The semiconductor memory device as claimed in claim 1, having a single pair of redundant bit lines, wherein the third switching means include an inverter for inverting an output from the redundant column decoder, and a plurality of switching elements which are controlled by a signal output from the inverter.

3. The semiconductor memory device as claimed in claim 1, having a plurality of pairs of redundant bit lines, wherein the third switching means include a NOR circuit which receives signals output from the redundant column decoders, and a plurality of switching elements which are controlled by a signal output from the NOR circuit, thereby the third switching means connect the first and second pairs of data lines when the NOR circuit does not receive any redundant signal and disconnects the second pair of data lines from the first pair of data lines when the NOR circuit receives the redundant signal from any one of the plurality of redundant column decoders.

4. The semiconductor memory device as claimed in claim 1, wherein each of said column decoders consists of a plurality of NAND circuits whose inputs are connected with an address bus carrying the column address signal, a NOR circuit connected to output terminals of the NAND circuits for receiving output signals from the NAND circuits, respectively, an inverter connected to an output terminal of the NOR circuit for inverting an output signal from the NOR circuit, a P-channel transistor and an N-channel transistor which are connected in series between a data signal output line and a ground and to which is applied a signal inverted by the inverter, a further N-channel transistor connected in parallel with said N-channel transistor, and a further inverter connected between said further N-channel transistor and the data signal output line.

* * * * *